(12) United States Patent
Alam et al.

(10) Patent No.: US 6,560,262 B1
(45) Date of Patent: May 6, 2003

(54) VERTICAL CAVITY SURFACE EMITTING LASER ARRAY AND A PROCESS FOR MAKING SAME

(75) Inventors: Muhammad Ashrafal Alam, Scotch Plains, NJ (US); Mark S. Hybertsen, West Orange, NJ (US)

(73) Assignee: Triquint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/370,667

(22) Filed: Aug. 9, 1999

Related U.S. Application Data
(60) Provisional application No. 60/117,239, filed on Jan. 26, 1999.

(51) Int. Cl.[7] .............................................. H01S 5/183
(52) U.S. Cl. .............................. 372/50; 372/23; 372/96
(58) Field of Search ............................. 372/50, 45, 46, 372/96, 92

(56) References Cited

U.S. PATENT DOCUMENTS
5,960,024 A * 9/1999 Li et al. ........................ 372/96

FOREIGN PATENT DOCUMENTS
EP          0817340 A1    1/1998    ............. H01S/3/25

OTHER PUBLICATIONS
Maeda, et al., *IEEE Photonis Technology Letters*, "Multigigabit/s Operation of 16–Wavelength Vertical–Cavity Surface–Emitting Laser Array", vol. 3, No. 10, pp. 863–865, Oct. 10, 1991.

(List continued on next page.)

*Primary Examiner*—Quyen Leung

(57) ABSTRACT

An array of VCSEL devices and a process for fabricating the VCSEL array is disclosed. The VCSEL array emits light at n different wavelengths, wherein n is at least two. A first portion of the VCSEL devices in the array emits light at a first wavelength and a second portion of the VCSEL devices emits light at a second wavelength. Each VCSEL device has an active region consisting of alternating bands of quantum wells and boundary layers bounded by top and bottom separate confinement layers. The active region is bounded by top and bottom mirrors. The length of the active region of the VCSEL devices that emit light at the first wavelength, $\lambda_{s1}$, is different from the length of the active region of the VCSEL devices that emit light at a second wavelength.

The array is fabricated by forming successive layers of material on a III-V semiconductor substrate. The composition and dimensions of the individual devices are first determined from the desired emission wavelength, $\lambda_{sn}$, of the devices in the array. Devices that emit at wavelength $\lambda_{s1}$ have an active region with length $L_1$. Devices that emit at wavelength $\lambda_{s2}$ have an active region with length $L_2$. From this information, the desired difference in the length of the active regions of the devices in the array that emit at different wavelengths, $\Delta L$, is determined. In addition, the thickness and composition for the individual quantum well layers is determined such that the peak in the optical gain will be achieved at the desired wavelength for each device.

Array fabrication is commenced by depositing at least one layer having uniform composition and thickness on the III-V substrate. An oxide mask is formed on the at least one layer of uniform thickness. The oxide mask is a pattern of oxide pads that are used to control the MOCVD growth rate and the composition of III-V semiconductor material subsequently formed thereon. The oxide mask pattern is selected to provide a layer of III-V semiconductor material that meets the composition and dimension specifications for the devices in the array. After the desired pattern is determined, and the oxide pads are formed, a III-V semiconductor material is formed on the substrate by MOCVD. During the growth step, the quantum well layers of the desired thickness and composition are formed. The growth is continued until the desired $\Delta L$ is obtained. MOCVD is then stopped and the oxide mask is removed. A layer of III-V semiconductor material having uniform composition and thickness is then deposited on the structure. This deposition step continues until sufficient material is deposited on the structure from which to form an array of devices having active regions with the desired $L_n$. A layer of material having uniform composition that will become the top mirror of the VCSEL devices is then deposited on the structure. The desired devices are then etched from the desired structure.

5 Claims, 5 Drawing Sheets

OTHER PUBLICATIONS

Wipiejewski, et al., *IEEE Photonics Technology Letters*, "Vertical–Cavity Surface–Emitting Laser Diodes With Post–Growth Wavelength Adjustment", vol. 7, No. 7, pp. 727–729, Jul. 7, 1995.

Yuen et al., *IEEE Photonis Technology Letters*, "Multiple–Wavelength Vertical–Cavity Surface–Emitting Laser Arrays With A Record Wavelength Span", vol. 8, No. 1, pp. 4–6, Jan., 1996.

Luong et al., *IEEE Photonics Technology Letters*, "Monolithic Wavelength–Graded VCSEL and Resonance–Enhanced Photodetector Arrays for Parallel Optical Interconnects", vol. 10, No. 5, pp. 642–644, May, 1998.

Babic et al., *IEEE Jouranl of Quantum Electronics*, "Design and Analayis of Double–Fused 1.55–um Vertical–Cavity Lasers", vol. 33, No. 8 pp. 1369–1383, Aug. 1997.

Ortiz et al, *IEEE Photonics Technology Letters*, "Monolithic, Multiple–Wavelength Vertical–Cavity Surface–Emitting Laser Arrays by Surface–Controlled MOCVD Growth Rate Enhancement and Reduciton", vol. 9, No. 8, pp. 1069–1071, Aug., 1997.

Koyama et al., *IEEE Photonics Technology Letters*, "Wavelength Control of Vertical Cavity Surface–Emitting Lasers by Using Nonplanar MOCVD", vol. 7, No. 1, pp. 10–12, Jan. 1995.

Babic et al., *Appl. Phys. Lett*, "Double–Fused 1.52–um Vertical–Cavity Lasers", vol. 66, No. 9, pp. 1030–1032, Feb. 27, 1995.

Hou et al., *IEEE*, "Wavelength–Division Multiplexing Vertical–Cavity Surface Emitting Laser Arrays Fabricated by Selective Area MOCVD Growth", vol. 2, pp. 23–24, 1998. (Dec. '98).

Chang–Hasnian, *IEEE*, "Vertical–Cavity Surface–Emitting Lasers: 2–D Arrays", Conference On Optical Fiber Communications, p. 100, 1992. (No month available).

Luong et al., *IEEE Photonics Technology Letters*, "Monolithic Wavelength–Graded VCSEL and Resonance–Enhanced Photodector Arrays for Parallel Optical Interconnect", vol. 10, No. 5, pp. 642–644, May 1, 1998.

Wipiejewski et al., *IEEE Photonics Technology Letters*, "Vertical–Cavity Surface–Emitting Laser Diodes With Post–Growth Wavelength Adjustment", vol. 7, No. 7, pp. 727–729, Jul. 1, 1995.

Ortiz et al., *IEEE*, vol. 9, No. 8, pp. 1069–1071, Aug. 1, 1997.

Orenstein et al., *Appl. Phy. Lett.*, vol. 69, No. 13, pp. 1840–1842, Sep. 23, 1996.

* cited by examiner

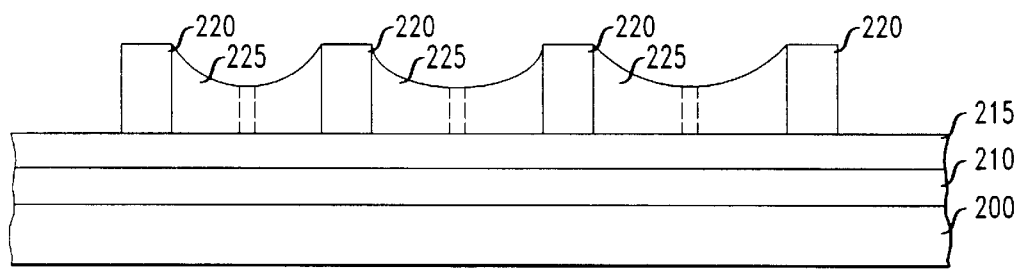
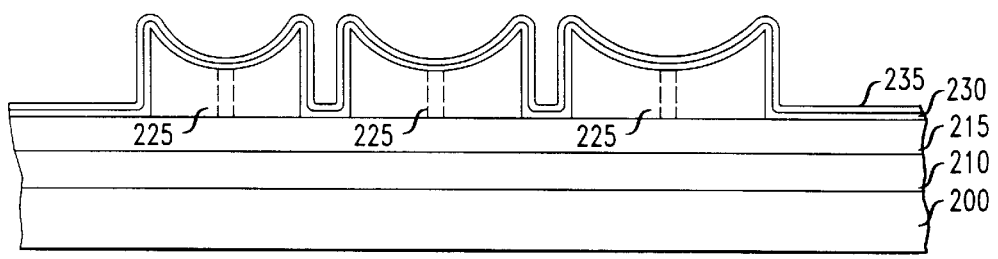
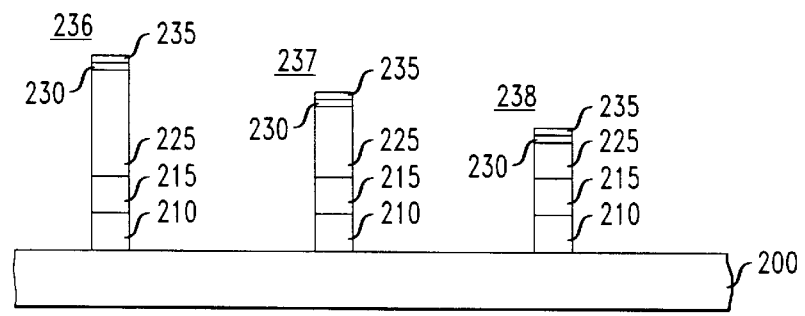

VERTICAL CAVITY SURFACE EMITTING LASER ARRAY AND A PROCESS FOR MAKING SAME

PRIORITY APPLICATION INFORMATION

This application claims priority of Provisional Patent Application Ser. No. 60/117,239 filed Jan. 26, 1999 and entitled "Process For Fabricating A Vertical Cavity Surface Emitting Laser Array."

BACKGROUND OF THE INVENTION

1. Technical Field

The present invention relates to vertical cavity surface emitting lasers (VCSELs) and, more specifically, to a process for fabricating surface emitting lasers.

2. Art Background

Laser arrays capable of both high-speed and multiple wavelength operation are important for high-capacity optical network applications based on high-density wavelength division multiplexing (HD-WDM). The laser array is formed on a single semiconductor substrate. Such arrays are referred to as monolithic arrays because they are formed on a single substrate. The emission wavelength of a laser is determined by its cavity length (which includes the length of the active region in the direction of the emission) and the refractive index of the materials in the cavity. Therefore, in an array of devices in which not all devices emit at the same wavelength, not all devices in the array have the same cavity length and/or the same material composition (refractive index). That is, some of the devices have a first cavity length and/or a first refractive index and emit at a first wavelength, some devices have a second cavity length and/or a second refractive index and emit light at a second wavelength, etc.

Two types of monolithic arrays of laser devices have been formed. In one type, light is emitted in a direction parallel to the substrate. In a second type, light is emitted in a direction perpendicular to the substrate. This second type of monolithic array is referred to as vertical cavity surface emitting lasers (VCSELs). The first type of array is somewhat easier to fabricate than a VCSEL array. However, a VCSEL array is advantageous because the individual lasers in a VCSEL array can be processed, tested, bonded, and operated in parallel.

An array of VCSEL devices has a plurality of such devices formed on a single substrate. In FIG. 1, three VCSEL devices, 110, 115, and 120 are illustrated. The three devices are formed on a single substrate 125. Each device 110, 115, and 120 has a bottom mirror 130 and a top mirror 135. The mirrors are typically Bragg mirrors made of a dielectric material. The Bragg mirrors have a high (i.e. 99.9 percent) degree of reflectivity over a broad (i.e. on the order of 30 nm to 40 nm) range of wavelengths. Each device has a cavity region 140, 145, and 150. The cavity region is a composite semiconductor material, typically a III-V semiconductor material (the III and V referring to groups of elements in the Mendeleev periodic table). Each cavity region has a top confinement layer 155 and a bottom confinement layer 160. A small portion of the top mirror 135 and bottom mirror 130 is also part of the cavity region.

The devices 110, 115, and 120 are depicted as having two quantum wells, 165 and 170, each. One skilled in the art will recognize that the number of quantum wells in an active region is largely a matter of design choice. Barrier layers 175 are formed between the individual quantum wells, 165 and 170; between the top quantum well 170 and the top separate confinement layer 155; and between the bottom quantum well 165 and the bottom separate confinement layer 160. The combination of quantum well layers and barrier layers is referred to herein as the device active region.

In the devices depicted in FIG. 1, the cavity region 140 of device 110 has a first thickness, the cavity region 145 of device 115 has a second thickness, and the cavity region of 150 of device 120 has a third thickness. Because the total thickness of the cavity region affects the wavelength of the light emitted by the laser, each device, 110, 115, and 120 emits light at a wavelength that is different from the emission wavelength of the other two devices. The thickness of the cavity region determines the wavelength of light emitted by the device. Furthermore, the active region of the device is the source of optical gain (which is required for laser operation) when the device is biased properly. The relationship between the optical gain spectra and the emission wavelength of the device affects device performance. For example, peak laser operation efficiency is obtained when the peak of the optical gain spectra for a device coincides with the emission wavelength of the device.

Several different techniques have been proposed for fabricating VCSEL arrays in which some devices have a cavity region with a first length and other devices have a cavity region with a length other than the first length. Maeda, M., et al., "Multigigabit/s Operation of 16-Wavelength Vertical-Cavity Surface-Emitting Laser Array," *IEEE Photonics Technology Letters*, Vol. 3, No. 10, pp. 863–865 (1991) describes a technique in which the VCSEL array is formed by using molecular beam epitaxy to form the active layer of the VCSEL devices. In order to obtain an array of VCSEL devices in which the thickness and composition of the active region varies among the devices, the wafer is not rotated as the material for the active region is deposited. This results in compositional and thickness variations in the layer. The VCSEL devices formed from this layer emit light at a wavelength that is determined by the thickness and composition of the portion of the active layer for a particular device. However, it is difficult to precisely control the thickness and compositional variations in an active layer formed using this technique. Consequently, since the differences in the composition and thickness of the MBE layer is the result of random differences that occur in the layer during its formation, it is difficult to control the difference between the different lasing wavelengths of the devices in the array. It is also difficult to control the tuning of the gain peak and cavity modes for the devices using this technique.

Wipiejewskil, T., et al., "Vertical-Cavity Surface-Emitting Laser Diodes with Post-Growth Wavelength Adjustment," *IEEE Photonics Technology Letters*, Vol. 7, No. 7, pp. 727–729 (1995) describes a technique in which the cavity length is adjusted after it is formed using anodic oxidation and etching. In this process, the cavity for the devices in the array is formed over an AlAs-GaAs (aluminum arsenide-gallium arsenide) Distributed Bragg Reflector (DBR). The cavity is formed by epitaxial growth of a composite semiconductor material on the DBR. The cavity layer, as formed, is uniform in composition and thickness over the surface of the substrate. The cavity layer is then selectively etched to set the laser cavity length for the individual devices in the array. The lasing mode of each device in the laser array is thereby set in this manner. However, because the composition of the quantum wells is the same for all of the devices in the array, the wavelength of the gain peak is the same for all of the devices in the array. Consequently, the gain peak cannot be controlled to match the cavity mode. Furthermore, the device is very complex to manufacture, due to the multiple mask levels required to accomplish the etching.

The relationship between the gain spectra, the emission wavelength, and the reflectivity of the DBR better understood with reference to FIG. 2. In FIG. 2, the reflectivity of the DBR as a function of wavelength is illustrated by line 190. As illustrated in FIG. 2, a DBR that has a reflectivity close to 1 over a wide wavelength range can be formed. Thus a single deposition step that provides a reflectivity of 1 over a broad range of wavelength can be used as the DBR for any laser device that emits light in that broad range. A wavelength emission spectrum is illustrated by line 191. The wavelength emission spectrum is the range of wavelengths of light that are emitted by the device active region. Note that the wavelength emission spectrum (as a function of power) has peak wavelength, $\lambda_g$. This is the peak emission wavelength, i.e. that wavelength of light in the optical emission spectrum that is emitted at maximum intensity. The laser cavity of the device also has an emission spectra and is illustrated by line 192. The peak emission wavelength for the cavity is illustrated as $\lambda_c$ (also referred to as the cavity mode). VCSEL devices emit light at peak efficiency when $\lambda_g$ equals $\lambda_c$.

Yuen, W., et al. "Multiple-Wavelength Vertical-Cavity Surface-Emitting Laser Arrays with a Record Wavelength Span," *IEEE Photonics Technology Letters,* Vol. 8, No. 1, pp. 4–6 (1996) describes a process in which the local temperature of the substrate surface is controlled during the formation of the layer which becomes the active region of the devices in the array. The layer is grown by molecular beam epitaxy (MBE). The temperature of the substrate affects the MBE growth rate. The back of the substrate is patterned. When placed on a uniformly heated substrate-holder, the thinner regions of the substrate have a different temperature compared to the thicker regions. This leads to different growth rates in different parts of the wafer. Although the thickness of the active layer for individual devices is controllable using this technique, the composition is not controllable for individual devices. Consequently, the gain peak of the individual device cannot be controlled to match the cavity mode.

In Luong, S. Q., et al., "Monolithic Wavelength-Graded VCSEL and Resonance-Enhanced Photodetector Arrays for Parallel Optical Interconnects, *IEEE Photonics Technology Letters,* Vol. 10, No. 5, pp. 642–644 (1996), the VCSEL array is formed on the surface of a patterned substrate (i.e. a series of photolithographically defined ridges and channels). A standard AlGaAs-GaAs VCSEL structure is grown by low pressure MOCVD (metal-organic chemical vapor deposition). Since the MOCVD growth rate is affected by the pattern, the thickness of the individual VCSELs formed on the surface of the substrate depends upon the portion of the substrate on which they were formed. However, the precise pattern needed to produce the desired VCSEL array must be determined empirically, which makes the design process difficult. Furthermore, it is difficult to obtain devices that have a gain peak that matches the cavity mode using this technique.

Accordingly, processes for making a monolithic array of VCSEL devices that emits light at multiple wavelengths have been proposed. However, a process for fabricating such an array which permits the gain peaks of the individual devices in the array to be tuned to the cavity mode is desired. Additionally, a process which reproducibly and accurately produces an array of devices in which the individual devices emit light at specified wavelengths is desired. In particular, a process which permits the manufacture of a number of identical arrays on the same wafer is desired.

SUMMARY OF THE INVENTION

The present invention is directed to the fabrication of a monolithic array of VCSEL devices. The array emits light at multiple (n) wavelengths, and n is at least two. Although the array of devices emits light at n wavelengths, each individual device in the array emits light at a specified wavelength ($\lambda_{sn}$). The array is fabricated such that a portion of the total number of individual devices that make up the array emit light at one wavelength ($\lambda_{s1}$) and another portion of the total number of individual devices in the array emit light at a second wavelength ($\lambda_{s2}$). Although, at a minimum, the array emits light at two different wavelengths, the present invention contemplates fabricating an array of devices that emits light at three or more different wavelengths.

In the process of the present invention, the particular emission wavelengths ($\lambda_s$) for the VCSEL array are first specified. Some devices emit light at $\lambda_{s1}$, some devices emit light at $\lambda_{s2}$, etc. Based upon the reflectivity of the materials selected for the mirrors of the device and the desired wavelength of the cavity modes ($\lambda_c$), the total thickness for the cavity region ($L_n$) associated with each $\lambda_{cn}$ is determined.

The devices are also designed so that a desired relationship between $\lambda_c$ and the peak wavelength ($\lambda_g$) of the optical gain spectrum of the device is obtained. The optical gain spectrum of a device is determined by the composition and thickness of the active region within the cavity region. An advantage of being able to fabricate an array of devices with a desired relationship between $\lambda_g$ and $\lambda_c$ is that, for one operating voltage, threshold current for all devices in the array will be about the same. This desired relationship is about uniform for all of the devices in the array. That is, the difference between $\lambda_s$ and $\lambda_g$ for all devices in the array is within about 5 nm for all the devices. For example, ($\lambda_{s1}-\lambda_{g1}$) is within 5 nm of ($\lambda_{s2}-\lambda_{g2}$). It is advantageous if the difference between $\lambda_s$ and $\lambda_g$ is within a range of 2 nm for all of the devices in the array.

Devices emit most efficiently at the selected $\lambda_s$ when $\lambda_g$ is approximately equal to $\lambda_c$. Therefore, in one embodiment of the present invention, the process is designed to provide an array of devices in which $\lambda_g$ is approximately equal to $\lambda_c$ for each device. Therefore, based on the desired $\lambda_s$, the composition and thickness ($W_n$) of the quantum wells that are required for VCSEL devices to emit at the peak wavelength $\lambda_{gn}$ of the gain spectra (wherein $\lambda_{sn}=\lambda_{gn}$) are determined. The composition and thickness for each quantum well is selected so that all devices in the array will emit efficiently at the operational voltage for the array. Next, the relationship between $L_n$ and $\lambda_{sn}$ is determined. The differences between $L_n$ for the various devices in the array (e.g. the difference between $L_n$ and $L_{n+1}$) is also determined. This is referred to herein as the desired $\Delta L$.

Once the overall thickness ($L_n$) of the cavity region, the mirror material, and the composition and thickness ($W_n$) of the quantum wells is determined for the devices in the array that emit at each $\lambda_{sn}$, the process is designed to fabricate the array of devices. First, a layer of uniform thickness and composition is formed on the substrate. This first layer is the bottom mirror of the device.

Selective area growth (SAG) is used to control the overall thickness of the cavity regions of the individual devices in the VCSEL array in order to obtain the desired $\Delta L$. SAG is also used to control the growth rate (R) of the III-V semiconductor material that, by virtue of subsequent processing, becomes the device active region of the VCSEL devices. The portion formed by SAG includes the device active regions containing the quantum wells.

Referring to FIG. 3A, a layer of uniform thickness 210 is first formed on the semiconductor substrate 200. The substrate 200 is typically a III-V semiconductor such as gallium arsenide or indium phosphide. The layer of uniform thickness 210 functions as the bottom mirror (a distributed Bragg Reflector) for the individual devices in the array. The distributed Bragg reflector is a multilayer film in which the individual layers alternate between a first material and a second material. Examples of suitable alternating layers for DBRs include indium-gallium-arsenide-phosphide/indium phosphide, and aluminum-arsenide/gallium arsenide. In this embodiment of the present invention, a second layer of uniform thickness 215 is formed over the bottom mirror 210. This second layer 215 is the bottom separate confinement layer for the devices in the array. In this embodiment, additional portions of the VCSEL devices are selectively formed on the bottom confinement layer. In another embodiment, additional portions of the VCSEL devices are selectively formed directly on the bottom mirror.

After the layer or layers of uniform thickness are formed, selective area growth (SAG) is used to selectively control the thickness of the device active layers in order to obtain an array of devices that emits light at the desired wavelengths. In selective area growth, oxide pads 220 are used to control the placement, thickness and composition of III-V semiconductor materials. The use of SAG to control the placement, thickness and composition of III-V semiconductor materials is described in "PROCESS FOR FABRICATING AN OPTICAL WAVEGUIDE," U.S. Pat. No. 6,261,857 filed Jun. 17, 1998, which is hereby incorporated by reference. As described in that reference, oxide pads are used in SAG to control the relative growth rate of a Group III-V semiconductor material in the region near the oxide pads. The dimensions and placement of the oxide pads in the SAG mask affect the relative growth rate. Consequently, the dimensions and placement of the oxide pads are selected to control the thickness of the Group III-V layer formed on the wafer on which the SAG mask is formed. This results in regions of different thickness at different places on the wafer. Furthermore, if the III-V semiconductor is an alloy that contains more than one Group III or Group V element, the composition of the material grown proximate to the oxide pads will also vary as a function of the dimensions and placement of the oxide pads. Consequently, the dimensions and placement of the oxide pads are used to control the thickness (and, in certain instances, compositional variations) during MOCVD growth. For example, during SAG, the thickness of the III-V semiconductor material formed between a pair of oxide pads with a first set of dimensions is different from the thickness of the III-V semiconductor material formed between a pair of oxide pads with a second set of dimensions. In those instances where the III-V semiconductor contains more than one Group III or Group V element, there will also be compositional variations between the material formed between the oxide pads with the first set of dimensions and the material formed between the oxide pads with the second set of dimensions.

In the process of the present invention, SAG is integrated with non-selective (i.e. uniform) MOCVD deposition to provide an array of devices in which the compositional and thickness variations of the quantum well layers, as well as the overall thickness of the cavity region of each device, translates into an array of devices wherein each device has the desired relationship between the peak of the emission spectra ($\lambda_g$) and the cavity mode ($\lambda_c$) and in which each device emits at a desired $\lambda_s$. As previously noted, devices in which $\lambda_g$ equals $\lambda_c$ operate at peak efficiency.

Using SAG, quantum well layers in the device active regions 225 of different thicknesses (and, in certain embodiments, composition) are formed in a single deposition step. Thus, the various $\lambda_g$'s for the various devices in the array (i.e., $\lambda_{g1}$ for device 1, $\lambda_g$ for device 2, etc.), is obtained by SAG. However, the devices 236, 237, and 238 are formed by some combination of uniform processing and SAG. SAG is used to provide the desired $\Delta L$ among the cavity regions of the devices in the array that emit at different wavelengths. The aggregate thickness of layers 215, 225, and 230 (plus a small portion of layers 210 and 235) is the cavity thickness that determines the $\lambda_c$ for the device. Uniform processing is used to ensure that the aggregate thickness (L) of these layers provides the desired $\lambda_c$ for the devices in the array.

Thus, SAG is continued until the desired difference in thickness is obtained for the active regions of the various devices in the array. Once the desired difference in thickness is obtained, and the quantum well structures have been formed by SAG, SAG is stopped.

As illustrated in FIG. 3B, after the device active regions 225 are formed, the oxide pads 220 are removed, leaving the active regions 225. A conformal layer of a III-V semiconductor material 230 is then formed over the surface of the structure. Another layer of uniform composition and thickness, 235, is formed over layer 230. The layer of uniform thickness 235 functions as the top mirror (a distributed Bragg Reflector) for the individual devices in the array. The distributed Bragg reflector is an alternating stack of materials as previously described.

Referring to FIG. 3C, the substrate is then etched to form the devices 236, 237 and 238. The width of these devices corresponds to the distance between the dashed lines in FIGS. 3A and 3B. The region defined by the dashed lines is equidistant between the oxide pads 220. For example, for a pair of oxide pads spaced 50 $\mu$m apart, the portion that is not removed is the portion that corresponds to a narrow portion (i.e. 5 $\mu$m) that is in the center between the two oxide pads. The center portion is selected because the variation in thickness as a function of proximity to the oxide pads increases with proximity to the oxide pads. Therefore, the III-V material formed between the oxide pads has its most uniform thickness in the center region between the oxide pads.

The cavity region of the devices 236, 237 and 238 consist of layers 215, 225, and 230 (and portions of the mirror layers 210 and 235). Layer 225 is the active region, which includes the quantum well structure for the devices. The compositional and thickness variations of layer 225 between devices 236, 237 and 238 are obtained by forming this layer using SAG.

The SAG oxide mask is designed by an iterative process. First, oxide pads of a certain dimension are selected, and the effect of the oxide pads on the growth rate of III-V material and the composition of the III-V material is modeled. The selected proximity and dimensions of the oxide pads are those that provide modeled composition and thickness of the III-V semiconductor material that will, with subsequent processing, provide devices that emit at the desired $\lambda_{sn}$ and have the desired $L_n$.

When SAG is commenced will depend on the relationship between the desired L and the desired $\Delta L$ for the devices in the array. If the desired $\Delta L$ is obtained through SAG of the quantum wells and the boundary layers between quantum wells alone, then SAG is optionally commenced after a second uniform-thickness layer is formed over the bottom mirror layer. This second layer, after subsequent processing, becomes the bottom confinement layer for the devices in the array. If the desired $\Delta L$ is not obtained by SAG of the quantum wells and boundary layers alone, then at least some portion of either the bottom confinement layer, the top confinement layer, or both, must be formed by SAG.

The present invention is further described using specific examples. The examples are provided for illustrative purposes and are not intended to limit the invention as desired by the appended claims.

BRIEF DESCRIPTION OF THE DRAWINGS

FIGS. 3A–3C is a schematic side view of the VCSEL array made using one embodiment of the process of the present invention.

DETAILED DESCRIPTION

Figure 1:
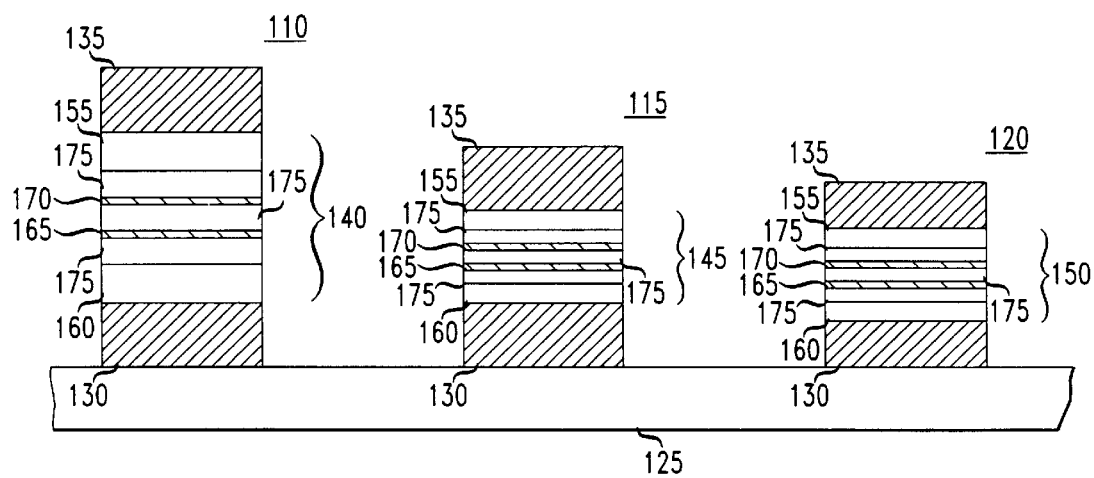
FIG. 1 is a schematic side view of a VCSEL array with three VCSEL devices, each device emitting light at a different wavelength.
Figure 2:
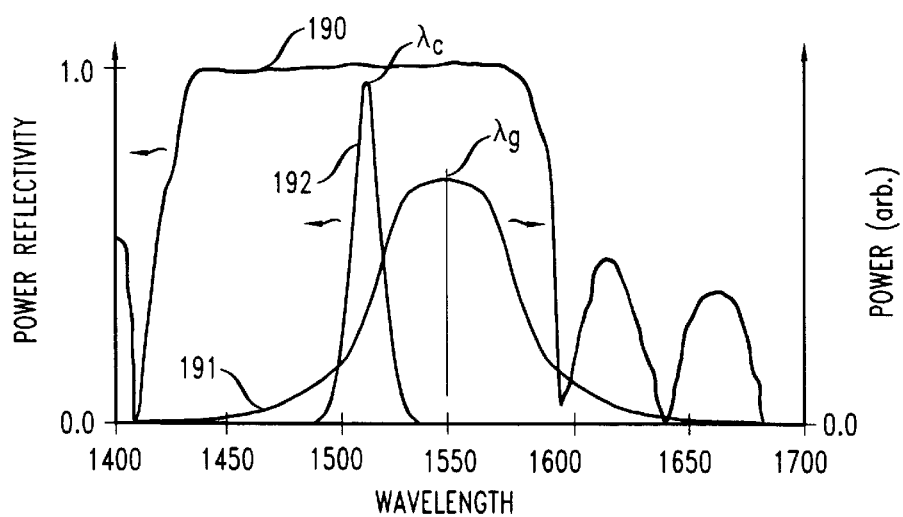
FIG. 2 compares the reflectivity of the DBR as a function of wavelength, optical gain spectra as a function of wavelength and the cavity mode, $\lambda_c$, of a VCSEL device.

The following are illustrative examples of using SAG to form VCSEL arrays that emit at more than one wavelength. One skilled in the art will appreciate that the characteristics (e.g., wavelengths of emission, composition of quantum wells, overall thickness of the active region) of the devices in the VCSEL arrays described in these examples are for illustration purposes. The process of the present invention is useful for fabricating VCSEL arrays that emit light at more than one wavelength, but is not limited to fabricating individual VCSEL devices with the characteristics specified in the following examples.

In one embodiment of the present invention, all of the devices in the array have top and bottom mirrors with the same thickness. In a second embodiment of the present invention, all of the devices in the array have top and bottom-mirrors with the same thickness, and either the bottom separate confinement layer, the top separate confinement layer or both have about the same thickness. In a third embodiment of the present invention, at least one quantum well in each VCSEL device in the array is approximately equidistant between the bottom separate confinement layer and the top separate confinement layer.

In the present process, a monolithic array of devices that emits light at a plurality of specified wavelengths, $\lambda_s$, is formed. The array of devices emits light at n wavelengths, where n is at least two. Each emission wavelength, $\lambda_{sn}$, for the array is determined from operational specifications.

The desired emission wavelength, $\lambda_{sn}$, for the devices is obtained by first determining the physical design parameters for VCSEL devices that will emit light at the desired wavelengths. Typically the physical design parameters are selected to provide an active region that has the peak wavelength, $\lambda_g$, in its gain spectrum that is equal to $\lambda_s$. One skilled in the art will appreciate that the present process can be used to obtain devices that have a desired relationship between $\lambda_g$ and $\lambda_s$ and is not limited to fabricating devices in which $\lambda_g$ is equal to $\lambda_s$. The physical design parameters of the active region include the composition of the one or more quantum wells in the 206 active region and the thickness or width ($W_n$) of the individual quantum wells.

These parameters are controlled to provide a $\lambda_g$ that is approximately equal to $\lambda_s$. The overall length, L, of the active region is selected so that the cavity wavelength, $\lambda_c$, is also approximately equal to $\lambda_s$.

The overall cavity length, L, of the active region includes the thickness of the quantum well(s), $W_n$, the thickness of the barrier layer(s), $W_{barr}$, adjacent the quantum well(s), and the thickness of the top, $W_{sch,t}$, and bottom, $W_{sch,b}$, separate confinement layers. The devices that emit at wavelength $\lambda_{cn}$ have an associated cavity length, $L_n$. The difference between the length of device $L_n$ and device $L_{n+1}$ is referred to as $\Delta L$. The desired $\Delta L$ is obtained by using SAG to form a III-V semiconductor layer with non-uniform thickness on the substrate. The variations in thickness provided by SAG provide the desired $\Delta L$.

For purposes of illustration, an exemplary VCSEL array consists of a periodic array of eight (i.e., n=8) VCSEL devices with lasing wavelengths that are separated by 3.5 nm. The reference laser in the array has a wavelength ($\lambda_{s1}$) of 1500 nm.

In this example, the active layers are made of quaternary compound semiconductor materials (InGaAsP). In such materials, the index of refraction changes very little as a function of the relative amounts of the four elements in the composition. GaAs is an example of a suitable material for the dielectric Bragg mirrors. GaAs mirrors provide the desired refractive index difference between the active region and mirror of the device. The mirrors of these devices are formed using the process described in Babik, D. I., et al., "Design and Analysis of 1.55 μm Double Fused Vertical Cavity Lasers, *IEEE J. of Quantum Electronics,* Vol. 33, No. 8, p. 1369 (1997), which is hereby incorporated by reference. The mirror material has a reflectivity coefficient at the emission wavelength, $r(\lambda_s)$ of about one at all values of $\lambda_{sn}$ for the devices in the array.

As previously noted, the desired $\lambda_s$ is obtained by controlling the quantum well composition and the quantum well width to obtain a $\lambda_g$ that is approximately equal to $\lambda_s$, and controlling the length (L) of the active region of the devices so that $\lambda_c$ is also approximately equal to $\lambda_s$. For each $\lambda_{sn}$, there is an associated quantum well composition, a quantum well width ($W_n$) and an $L_n$. The gain spectra for a quantum well structure is readily determined by one skilled in the art. Consequently, once $\lambda_s$ is specified, one can design a quantum well structure in which the peak wavelength, $\lambda_g$, of the gain spectra is equal to $\lambda_s$.

As previously noted, the difference in the emission wavelength of the devices in the array of the present example is 3.5 nm. Thus, the devices in the array emit light at one of the following wavelengths: 1500 nm, 1503.5 nm, 1507 nm, 1510.5 nm, 1514 nm, 1517.5 nm, 1521 nm, and 1524.5 nm.

$L_n$ is computed from the following relationship:

$$\phi_b'' + \phi_t'' + \phi_{cav}(L_n, \lambda_c'') - 2m\pi = 0. \quad (1)$$

In equation (1) the phases of reflectivity of the bottom and top mirrors and the reflectivity of the cavity are $\phi$. The thicknesses of the quantum well, barrier layers, and top and bottom confinement layers are all included in the overall length, L. The cavity mode is designated by $\lambda_c$, and m is the degree of the mode (typically one (1)).

Once the relationship between $\lambda_{cn}$ and $L_n$ is determined, $\Delta L$ for the devices in the array is readily determined. Based upon the desired $\lambda_{gn}$ and the desired $\Delta L$, an oxide mask is designed that will provide a layer of III-V semiconductor material with the requisite variations in composition and thickness that will be subsequently formed into the desired array of devices.

Figure 4A:
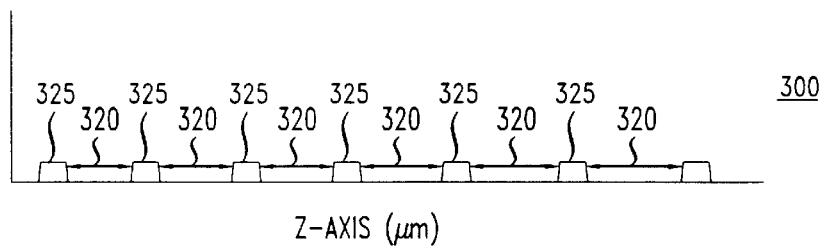
FIGS. 4A–4H illustrates a schematic side view of an oxide mask consisting of a series of oxide pads in which the distance between adjacent pads is not uniform and the effect of the non-uniform distance on the growth rate and composition of the III-V semiconductor material between the pads.

The spacing and size of the oxide mask is determined by the following iterative process. A schematic illustration of an oxide mask suited for forming the array of VCSEL devices in this example is illustrated in FIG. 4A. FIG. 4A is a side view of the SAG mask 300. The x-axis is in microns, and illustrates that the distance 320, between adjacent pads 325 is not uniform. Since the growth rate (R) of the III-V semiconductor material and the composition is a function of the distance between the adjacent pads 325, the growth rate between each individual pair of oxide pads 325 is different.

Based on the desired $\lambda_{g_n}$ of the device, the dimensions of the oxide pads are selected that will yield a deposited III-V material from which quantum well structures with the requisite gain spectrum can be formed. The dimensions of the oxide pads are also selected to provide a growth rate ($R_n$) for the device that is different compared to the growth rate for devices that are to emit at different $\lambda_s$'s. The difference in growth rate, $\Delta R$, is selected so that, at the end of the SAG portion of the process, the desired $\Delta L$ in the deposited layer is obtained.

Figure 4B:
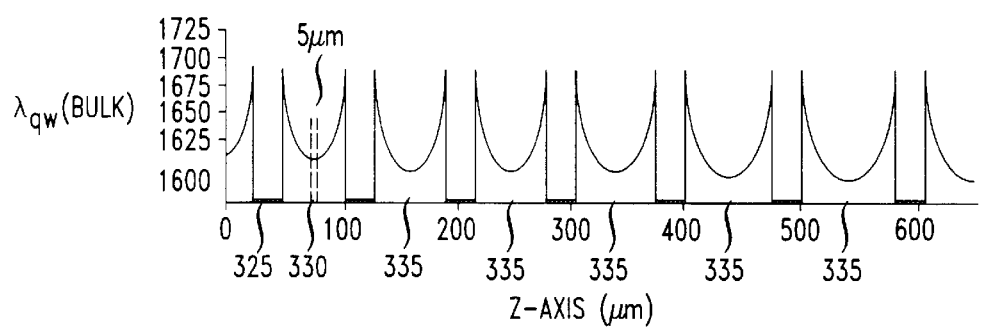
Figure 4C:
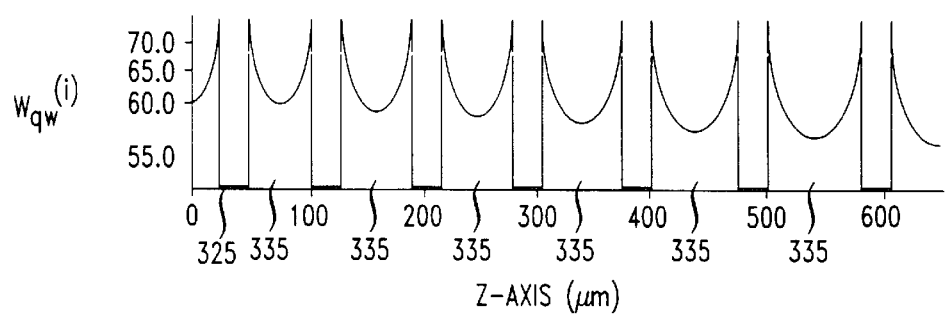

Once the dimensions of oxide pads that will provide an array of VCSEL devices with the desired distribution of thickness and composition are selected, the composition and thickness of the active regions of the VCSEL devices formed using such a mask is modeled. The modeled compositional variations that result in the material 335 grown using such a mask is illustrated in FIG. 4B by the differences in $\lambda_{qw}$ for the materials between each pair of oxide spacers. The modeled thickness variations that result in the material 335 grown using the mask is illustrated in FIG. 4C. Although the materials 335 illustrated in FIG. 4B and 4C have a bowl-shaped profile, only the narrow (about 5-$\mu$m wide) center region 330 (illustrated by the dashed lines in FIG. 4B) of the deposited material is used to form the VCSEL devices.

Figure 4D:
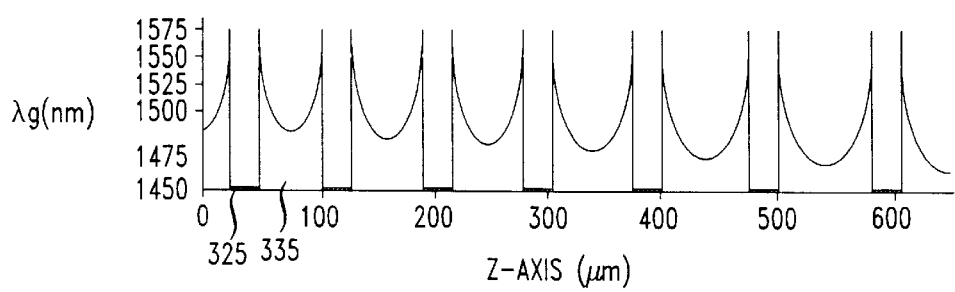

Assuming that the composition and thickness for each quantum well illustrated in FIG. 4C is known, the bound levels for electrons and holes are determined using Schrodinger's equation. The Schrodinger equation verifies that a VCSEL device with the proposed composition and dimensions will emit at the desired $\lambda_s$. The gain peak for each individual device ($\lambda^i_g$) is assumed to coincide with the separation between these bound levels (or at least to have a definite relationship). If these gain peaks do not satisfy the specified inter-channel wavelength separation (e.g. the wavelength separation between $\lambda_{sn}$ and $\lambda_{s+1}$), the spaces between the oxide pad are adjusted and the process simulation is repeated until the desired correspondence is obtained. The $\lambda_g$ associated with the material 335 formed between the oxide pads is illustrated in FIG. 4D.

Once the design of the oxide mask that will provide the desired differences in composition and growth rate during SAG, it is next determined when to start and stop the SAG process. If the desired $\Delta L$ is obtained during the SAG formation of the quantum well and barrier layers alone, then fabrication of the array is commenced by forming a layer of mirror material having uniform thickness and composition on the III-V semiconductor substrate. A second layer of uniform thickness and composition is then formed over the mirror layer. This layer becomes the bottom separate confinement layer of the subsequently formed devices. However, it is advantageous not to initiate SAG with the formation of a material that will form the device quantum well. It is advantageous to commence SAG with the formation of a material that will either be part of the bottom confinement layer or the boundary layer.

Figure 4E:
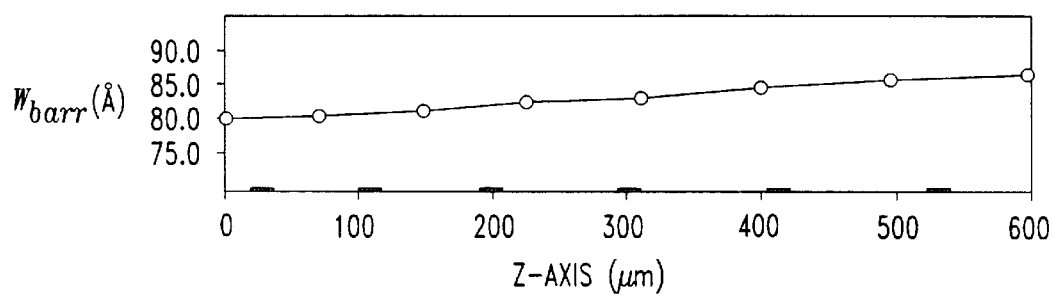
Figure 4F:
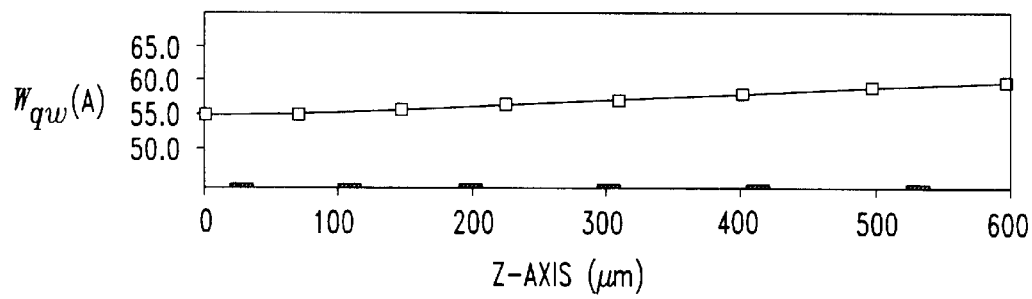

SAG is commenced by forming the oxide pads with the desired dimensions and placement on the surface of the second layer of material. As illustrated in FIG. 4E, the thickness of the barrier material grown during time (t) varies with the space between the oxide pads. The closer together the oxide pads, the thicker the material grown between them in a given time (t). A similar relationship is illustrated for the thickness of the quantum well material in FIG. 4F.

Figure 4G:
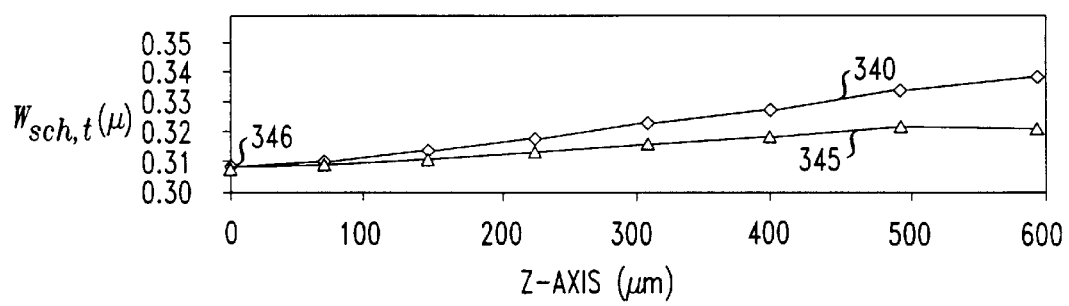
Figure 4H:
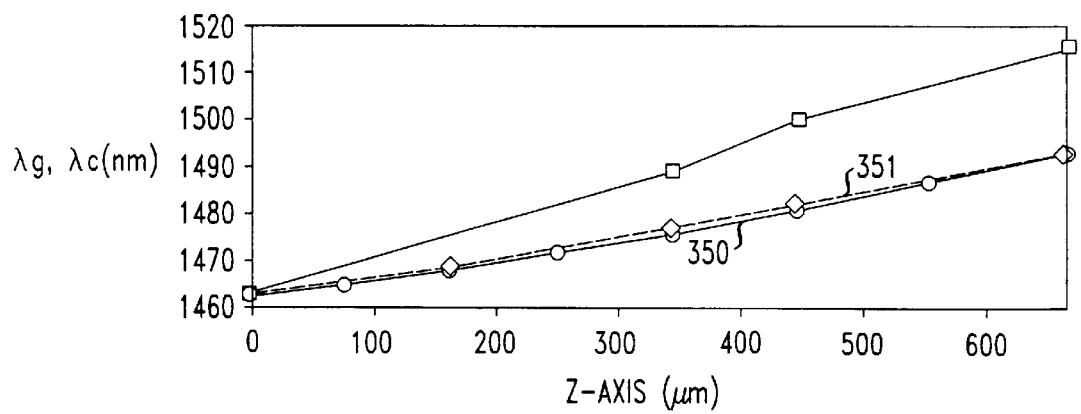

SAG is stopped when the actual $\Delta L$ approaches the desired $\Delta L$ for the devices in the array. The need to stop SAG when the desired $\Delta L$ is obtained is illustrated in FIG. 4G. In FIG. 4G, line 345 illustrates the desired range of thicknesses for the separate confinement layer of the devices in the array. In FIG. 4G, SAG is continued until the desired L for device 346 is obtained. Line 340 indicates the L's for the devices in the array when SAG is continued until the L for device 346 is obtained. Line 340 illustrates the L of all devices in the array if SAG is continued until the L of a particular device in the array is obtained. FIG. 4G illustrates that, if SAG is continued until the L of one of the devices in the array is obtained, the L of the other devices in the array will not be the desired L. FIG. 4H illustrates the same principle, but for $\lambda_g$ and $\lambda_c$ of the devices in the array. Specifically, if SAG is continued until an active layer thickness that corresponds to a desired $\lambda_g$ or $\lambda_c$ of a device in the array is obtained, then after subsequent processing, none of the other devices in the array will have the desired $\lambda_g$ or $\lambda_c$. This is demonstrated by comparing lines 350 (the desired $\lambda_g$ for the devices in the array) and 351 (the desired $\lambda_c$ for the devices in the array) with line 352. Line 352 in FIG. 4H is the $\lambda_g$ or $\lambda_c$ of the devices when SAG continues until an active layer thickness that corresponds to a desired $\lambda_g$ or $\lambda_c$ of a device in the array is obtained.

Consequently, SAG is stopped when the desired $\Delta L$ is obtained, not when the desired L for a particular device in the array is obtained. The remaining deposition steps in the fabrication sequence are completed by depositing layer(s) of uniform composition and thickness on the surface of the substrate to obtain the desired array of devices.

Referring to FIG. 3B, when the desired $\Delta L$ is obtained, SAG is stopped. The oxide PADs 220 (FIG. 3A), are removed and the subsequent layers having uniform composition and thickness are formed on the structure. As shown in FIG. 3B, two such layers, 230 and 235, are formed. As shown in FIG. 3C, layer 230 is the top separate confinement layer and layer 235 is the top mirror of the devices, 236, 237, and 238. Also, as shown in FIG. 3C, the thickness of layers 230 and 235 is the same in devices 236, 237, and 238. However, each device 236, 237 and 238 has an active region 225 thickness that is different from the thickness of the active region 225 in the other devices.

The placement of the devices in the array in this example is merely illustrative. There is no requirement that devices be placed side-by-side in order of increasing or decreasing active region thickness. This arrangement was provided to clearly illustrate the relationship between the length of the cavity or active region of the VCSEL devices and $\lambda_c$. This arrangement was also provided to illustrate how SAG is used to obtain the desired $\Delta L$. This arrangement was also provided to show how the active regions are formed using a combination of SAG and non-SAG steps to form the various layers that make up the VCSEL devices.

What is claimed is:

1. A monolithic array of vertical cavity surface emitting laser devices that emits light at more than one wavelength comprising:
   a III-V semiconductor substrate;
   a plurality of vertical cavity surface emitting lasers formed on the III-V substrate, wherein a first portion of the plurality of vertical cavity surface emitting lasers emit light at a first wavelength and a second portion of the plurality of vertical cavity surface emitting lasers emit light at a second wavelength, wherein each device has a top mirror, a bottom mirror, a cavity region comprising a top separate confinement layer, a bottom separate confinement layer, and an active region, wherein the active region further comprises at least one quantum well layer bounded on each side by a boundary layer and wherein the at least one quantum well layer is about equidistant between the top separate confinement layer and the bottom separate confinement layer and the thickness of the at least one quantum well layer of the vertical cavity surface emitting lasers that emit light at the first wavelength is different than the thickness of the at least one quantum well layer of the vertical cavity surface emitting lasers that emit light at the second wavelength.

2. The monolithic array of vertical cavity surface emitting laser devices of claim 1 wherein the bottom separate confinement layer is about the same thickness for all of the devices in the array.

3. The monolithic array of vertical cavity surface emitting laser devices of claim 2 wherein the top separate confinement layer is about the same thickness for all of the devices in the array.

4. The monolithic array of vertical cavity surface emitting laser devices of claim 1 wherein the vertical cavity surface emitting lasers have a defined relationship between the emission wavelength and a peak gain wavelength and the defined relationship for the devices in the array are within a range of about 5 nm.

5. The monolithic array of vertical cavity surface emitting laser devices of claim 1 wherein the vertical cavity surface emitting lasers have a defined relationship between the emission wavelength and a peak gain wavelength and the defined relationship for the devices in the array are within a range of about 2 nm.

* * * * *